United States Patent [19]

Bakos et al.

[11] Patent Number: 4,670,325
[45] Date of Patent: Jun. 2, 1987

[54] STRUCTURE CONTAINING A LAYER CONSISTING OF A POLYIMIDE AND AN ORGANIC FILLED AND METHOD FOR PRODUCING SUCH A STRUCTURE

[75] Inventors: Peter Bakos, Austin, Tex.; Russell E. Darrow, Endicott, N.Y.; Nelson P. Franchak, Binghamton, N.Y.; Joseph Funari, Vestal, N.Y.

[73] Assignee: IBM Corporation, Armonk, N.Y.

[21] Appl. No.: 881,586

[22] Filed: Jul. 2, 1986

Related U.S. Application Data

[63] Continuation of Ser. No. 687,796, Dec. 31, 1984, abandoned, which is a continuation of Ser. No. 489,878, Apr. 4, 1983, abandoned.

[51] Int. Cl.[4] .............................................. H05K 3/46
[52] U.S. Cl. ..................... 428/209; 427/96; 427/97; 428/458; 428/901; 174/68.5; 156/668
[58] Field of Search ...................... 428/209, 458, 901; 427/96, 97; 174/68.5; 156/668

[56] References Cited

U.S. PATENT DOCUMENTS 3,615,913  10/1971  Shaw ................................. 148/33.3
4,246,147   1/1981  Bakos ................................ 427/282
4,386,116   5/1983  Nair ..................................... 427/89
4,525,383   6/1985  Saito ................................... 427/89

Primary Examiner—John D. Smith
Attorney, Agent, or Firm—Perman & Green

[57] ABSTRACT

A structure comprising on a substrate successive layers of metal circuitry having therebetween as a dielectric a cured polyimide composition containing a polyimide and aluminum oxide or zinc oxide or mixtures thereof.

The structure is produced by a method including the following process steps:

blanket screen printing a mixture containing a polyamido carboxylic acid, aluminum oxide or zinc oxide or mixtures thereof and a detackifier with the rest being a solvent on a substrate with a layer of metal circuitry thereon, drying the deposited layer at a temperature between about 25° and about 120° C., selectively etching holes into the deposited layer where vias between adjacent layers of metal circuitry are needed, curing the deposited layer at a temperature between about 300° and about 400° C. and forming another layer of metal circuitry.

7 Claims, No Drawings

STRUCTURE CONTAINING A LAYER CONSISTING OF A POLYIMIDE AND AN ORGANIC FILLED AND METHOD FOR PRODUCING SUCH A STRUCTURE

This is a continuation of co-pending application Ser. No. 687,796 filed on Dec. 31, 1984 now abandoned and a continuation of application Ser. No. 489,878, filed Apr. 4, 1983, now abanonded.

The invention relates to a structure combining metal circuitry and a dielectric consisting of polyimide and an inorganic filler and to a method for producing such a structure.

BACKGROUND OF THE INVENTION

Structures including layers of polyimide are known. Polyimide is a material which due to its dielectric properties and its chemical and mechanical resistance is attractive for many applications. It is also known to adapt the properties of polyimide for special purposes by blending a filler into the polyimide.

In the article "Screenable Alpha Particle Barrier", published in the IBM Technical Disclosure Bulletin, Vol. 23, No. 12, May 1981, p. 5281 is described that a solution containing a polyamic acid and boron nitride particles is screened on substrates to form an alpha particle barrier. The boron nitride particles, which are in the form of platelets also act as a thermally conducting material to increase heat transfer.

The article "Screened Multilayer Polyimide", published in the IBM Technical Disclosure Bulletin, Vol. 23, No. 1, June 1980, p. 109, teaches the formulation and use of a screenable adherent polyimide paste with low flow characteristics. In this paste graphite is used as a filler acting as a sponge to absorb the solvents in which the polyamic acid is dissolved. Thus, the graphite prevents excessive bleedout of the polyimide precursors and undesired flow. In use the paste is screened on a clean dry substrate and then cured at 350° C. Such a graphite-filled polyimide can be used to form a resisitive layer or capacitive layer. If desired, such formed resistive layers can have metallization either evaporated or sputtered thereon.

EP-A- No. 00 30 641 describes a blanket or selective coating consisting of polyimide and mica platelets. To produce the coating a solution of a polyamic acid containing the mica platelets is applied to a substrate either uniformly or through a screen having a desired pattern. The solvent is removed and the resulting layer is cured to a solid adhering coating. The coating is preferably used to insulate current-carrying metal patterns exposed on ceramic substrates onto which silicon chips with integrated circuits are mounted.

U.S. Pat. No. 3 615 913 describes polyimide and polyamide-polyimide coatings used as passivators for semiconductor surfaces and the production of such coatings. The coating contains a filler which consists of an electrically insulating material selected from the group of aluminum oxide, silicon oxide, glass fibers, boron nitride, quartz, mica, magnesium oxide and reactivated polytetrafluorethylene.

U.S. Pat. No. 4 246 147 describes the composition, the application by screening, the usage and the stripping of a solder mask. The screenable and strippable solder mask composition contains a polyepoxide or polyimide/amide, a detackifier, a high temperature resistant filler and a solvent. The applied solder mask protects predetermined areas on a substrate from the solder deposition. It is essential for the solder mask that it is readily strippable after its use. The solid filler must be one which is resistant to exposure to elevated temperatures. Examples of some suitable solid temperature resistant fillers include i.a. zinc oxide and alumina.

SUMMARY OF THE INVENTION

It is the object of the present invention to provide on a substrate a structure including at least two layers of interconnected metal circuitry with a polyimide based dielectric layer therebetween containing via holes and having excellent adhesive characteristics.

It is a further object of the invention to provide a dielectric layer being located between layers of interconnected metal circuitry and having closely spaced via holes with a diameter in the order of mils.

It is a further object of the invention to provide the dielectric layer having the favourable physical and chemical properties of polyimide.

It is also an object of the invention to provide a method for producing on a substrate a structure including at least two layers of interconnected metal circuitry with a polyimide based dielectric layer therebetween containing via holes.

It is a further object of the invention to provide a method to produce a polyimide based dielectric layer with a pattern of closely spaced small via holes reproducibly within small tolerances on a substrate with a layer of metal circuitry thereon.

It is a further object of the invention to provide a method for producing a structure with at least two layers of metal circuitry and a polyimide based dielectric layer therebetween being suitable for large scale manufacturing operation.

These objects are achieved by a structure comprising on a substrate successive layers of metal circuitry having therebetween as a dielectric a composition containing a polyimide and aluminum oxide or zinc oxide or mixtures thereof said dielectric being pinhole-free and uniformly etchable in its partly cvured form and having a uniform thickness and a pattern of closely spaced via holes and by a method for producing a structure comprising successive layers of metal circuitry having therebetween a dielectric characterized by the following process steps:

blanket screen printing a mixture containing a polyamido carboxylic acid, aluminum oxide or zinc oxide or mixtures thereof and a detackifier with the rest being a solvent, like N-methyl-2-pyrrolidone, on a substrate with a layer of metal circuitry thereon, partially curing the deposited layer by drying the deposited layer at a temperature between about 75° and about 120° C., selectively etching holes into the deposited layer at places where vias between adjacent layers of metal circuitry are needed, curing the deposited layer at a temperature between about 300° and about 400° C. and forming another layer of metal circuitry.

A uniform thickness means in this context that the topography of the dielectric is only influenced by the topography of the structure onto which the dielectric is applied. After the aforementioned partial curing step, the dielectric layer is uniformly etchable. Once the dielectric layer is finally cured, the surface thereof —provided the metal:polyimide thickness ratio does not exceed about 1:2— is essentially planar outside the via holes. Moreover, the dielectric layer has a uniform thickness. That is, the topography of the dielectric is influenced by the only topography of the structure onto which the dielectric is applied. The Al$_2$O$_3$ or ZnO increases the mechanical and thermal stability and the heat conductivity of the dielectric layer. The indicated properties are essential for the material to be used for the dielectric layer between two layers of metal circuitry especially if these layers are miniaturized and have closely spaced metal lines. The prior art gives no suggestion to use the Al$_2$0$_3$ or ZnO containing polyimide in the described way and due to the complexity of the problem to be solved the solution found is by no means obvious in view of the prior art. This also—and even more so—is true for the method aaccording to the invention. The prior art gives no suggestion to use a screenable composition containing a polyimide precursor and a filler which undergoes a photolithographic etching step after it is applied. In the method according to the invention the dielectric layer has to be applied by screen printing in order to get the required homogenity of the layer thickness over the metallized areas or not metallized areas respectively. A homogeneous layer thickness is necessary in the first place to avoid pinholes in the dielectric layer. However due to the small size of the via holes it would be very difficult to form the via holes in the screening process. Therefore the via holes has to be produced by an etching process. However there the problem arises: on the one side to make the composition screenable it must have a consistency that its subsequent treatment is difficult unless it is dried. On the other side in this drying step the imidization of the polyamido carboxylic acid contained in the screenable composition tends to proceed and if the imidization has proceeded to far the etching of the composition is not possible any more. The method according to the invention is however practicable because phe Al$_2$O$_3$ and the ZnO suppress the imidization. This not only maintains the etchability of the layer material, but also guarantees—together with the known reproducibility within small tolerances inherent to photolithographic etch processes—uniform etch rate over the whole substrate. This uniform from etch rate is the one prerequisite for achieving uniform via hole dimens. The other prerequisite is the homogenity of the layer thickness, which—as explained above—is achieved by the screen printing. So only the unique combination of screen printing, a drying process not essentially affecting the degree of cure of the polyimide and the photolithographic etch process guarantees the reproducible forming of a pattern of closely spaced small via holes. This combination is by no means suggested by the prior art.

Advantageous embodiments of the inventive structure are disclosed in the subclaims.

DESCRIPTION OF THE PREFERRED EMBODIMENT

The invention will become more apparent from the following detailed description.

The structure according to the invention is based on a substrate consisting for example of a ceramic or a semiconducting material. The following description is restricted to a structure based on a ceramic substrate. It is pointed out however that the substrate material is not critical for the structure according to the invention and that the details of the structure could be as well explained with regard to a structure being formed for example on a semiconductor chip.

The substrate consists of a square ceramic plate having a length of a side of preferably 24 to 36 mm. On this plate a metal circuitry is formed preferably consisting for example of a bottom layer of chromium with a thickness in the order of 80 nm, a middle layer of copper with a thickness in the order to 4 μm and an upper layer of chromium with a thickness in the order of 0 nm. The metal circuitry and the substrate areas exposed between the metal lines are covered by a dielectric layer. The thickness of the dielectric layer in the areas between the metal line is between about 2.54 μm and about 254 μm and preferably about 12.7 μm. Provided the metal circuitry: dielectric layer thickness ratio does not exceed 1:2 the surface of the dielectric layer outside is the via holes esentially planar. The dielectric layer consists of cured polyimide and Al$_2$O$_3$ or ZnO or a mixture of these two compounds as a filler. A typical representative of the polyimides has the following general formula:

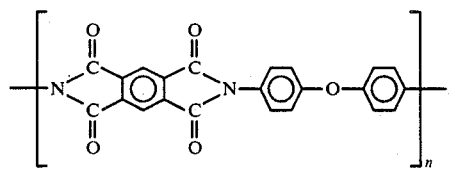

in which n is an integer of at least 5. The filler in the form of particles is homogeneously mixed with the polyimide. The size of the filler particles can vary between 0.25 to about 10 μm and is preferably 0.5 μm. The polyimide: filler ratio is between 4:6 and 6:4 with the optimum being 1:1. With an increasing amount of filler the dielectric properties are degraded and the thermal conductivity increases. A decreasing amount of filler effects the opposite results. At a 1:1 weight ratio of filler to polyimide the dielectric quality of the layer is still very satisfactory and its heat conductivity is high enough that the heat transfer from the structure according to the invention is sufficient to keep its temperature at a low level under operational conditions. The dielectric layer contains a pattern of via holes. The via holes have at their lower edge preferably a diameter of about 25 to 50 μm (1 to 2 mils) and their diameter at their upper edge is up to 100 μm (4 mils). The optimum taper of the via hole walls is about 45°. The via holes have uniform dimensions. On top of the dielectric layer a second layer of metal circuitry preferably consisting of the same materials and exhibiting the same layer thickness as the metal circuitry deposited on the substrate. The two layers of metal circuitry are interconnected through said via holes. The structure described so far can be covered by a passivating layer which consists for example of sputtered quartz, or a polymer or the same material as the dielectric layer, i.e. the filled polyimide. It is however also possible that a third, a fourth or even more layers of metal circuitry which are interconnected with their adjacent layers of metal circuitry, and the required dielectric layers therebetween which are basically the same as the one described above are deposited on said structure. Often structures with multilayer circuits are susceptable to shorts or near-shorts that cause early fallouts in the field. This problem is due to the difficulty to keep the surface of multilayer structures planar which becomes more and more critical with the increasing numbers of metal layers. This problem does not arise with the structure according to the invention since provided the above condition is observed, each of the dielectric layers has outside the via holes an essentially planar surface which is achieved with the method according to the invention described below in detail.

The structure according to the invention has a high heat conductivity, an extraordinary physical and thermal stability, corresponds within small tolerances to the predeterminded dimensions, e.g. concerning the layer thicknesses and the shape of the via holes, and the adherence of the dielectric layer or layers to the adjacent layers of metal circuitry is excellent.

The screenable composition used for producing a structure especially according to the invention contains a film-forming polymer portion in the form of a liquid composition, a detackifier, and a solid filler.

The film-forming polymer portion of the composition includes a polyimide/amide polymer. The polymer portion of the composition must be in the form of a liquid composition. Accordingly, the polymer portion is a solution or dispersion of the polyimide/amide in a non-reactive diluent.

The polyimide/amide polymers employed according to the present invention are well known and are available commercially. Such are sometimes referred to in the literature as polyamides or polyamide-acids and are actually non-fully cured polymers which contain varying amounts of amide and imide groupings along the polymer chain. The imide groups are obtained by condensation of the amide form with an acid group of the polymer chain. Such polymers are generally prepared by reacting at least one diamine with at least one polycarboxylic acid and/or anhydride thereof and/or ester thereof. Suggestions of various polyimide/amides can be found in U.S. Pat. Nos. 2,710,853; 2,712,543; 2,731,447; 2,880,230; 3,037,966; 3,073,784; 3,073,785; 3,179,631; 3,179,632; 3,179,633; 3,179,634; 3,179,635; and 3,190,856, disclosures of which are incorporated herein by reference. The preferred polyimide/amide polymers employed according to the present invention are those obtained by reacting an aromatic diamine with an aromatic tetracarboxylic acid dianhydride.

Examples of some anhydrides employed in preparing the polyimide/amide are pyromellitic dianhydride; melitic anhydride; trimellitic anhydride; 2,3,6,7-naphthalene tetracarboxylic dianhydride; 1,2,5,6-naphthalene tetracarboxylic dianhydride; 3,3',4,4'-diphenyltetracarboxylic dianhydride; 2,2',3,3'-diphenyltetracarboxylic dianhydride; 3,3',4,4'-diphenylmethane tetracarboxylic dianhydride; bis(3,4-carboxyphenyl)ether dianhydride; bis(2,3-dicarboxyphenyl)sulfone dianhydride; 3,3'4,4'benzophenone tetracarboxylic dianhydride; 3,3'4,4'stilbenetetracorboxylic dianhydride; 2,3,6,7-anthracenetetracarboxylic dianhydride; 1,2,7,8-phenanthrenetetracarboxylic dianhydride; 2,3,6,7-naphthacenetetracarboxylic dianhydride; 2,3,8,9-chrysene tetracarboxylic dianhydride; 2,3,6,7-triphenylene tetracarboxylic dianhydride; pyrene-4,5,9,10-tetracarboxylic dianhydride: perylene-3,4,9,10-tetracarboxylic dianhydride; and coronene-1,2,7,8-tetracarboxylic dianhydride.

Examples of some aliphatic organic diamines are ethylenediamine; N-methylethylenediamine; trimethylenediamine; tetramethylenediamine; 1,5-diaminopentane; hexamethylenediamine; 1,4-diaminocyclohexane; 1,3-diaminocyclopentane; 1,3-diamino-2-methylpropane; 1,6-diamino-4-methylhexane; 1,4-diamino-2-methyl butane; 1-(N-propylamino)-6-aminohexane; and 1,3-diamino-2-phenylpropane.

Examples of some aromatic-aliphatic diamines are paraaminophenylmethylamine, and meta-aminophenylmethylamine. Examples of some aromatic organic diamines are 2,2-di(4-aminophenyl)propane; 4,4'-diaminodiphenylmethane; benzidine; mono-N-methylbenzidine, 3,3'dichlorobenzidine; 4,4'diaminodiphenylsulfide; 3,3'-diaminodiphenyl sulfone; 4,4'-diaminodiphenyl sulfone; 4,4'-diaminodiphenylsulfone; 4,4'-diaminodiphenyl ether; 1,5-diaminonaphthalene; meta-phenylenediamine; paraphenylenediamine; 3,3'-dimethyl-4,4'-biphenyldiamine; 3,3'-dimethoxybenzidine; 1-isopropyl-2,4-phenylenediamine; 3,5-diaminoorthoxylene; 3,5-diaminodiphenyl; 1,3-diaminonaphthalene; 2,6-diamino anthracene; and 4,4'-diaminostilbene. The most preferred aromatic diamines are 4,4'-diaminodiphenyl ether, 4,4'-diaminodiphenylmethane and paraphenylenediamine.

The polyimide/amides employed according to the present invention generally have molecular weights from about 500 to about 2500, and when combined with just the diluent preferably have a viscosity of about 25—150 centipoises at normal room temperature (e.g. about 25° C.). The polyimide/amides are in the form of solid polymeric materials and, accordingly, are admixed with an inert diluent. Examples of some inert diluents which do not react with the diamines or dianhydrides employed to prepare the polyimide/amides or react with the product include organic polar solvents which have a dipole moment whose functional groups do not react with the precursors (e.g. the diamines or the dianhydrides). Examples of some suitable organic polar solvents include N,N-dimethylformamide, N,N-dimethylacetamide, N-methyl-2-pyrrolidone, N,N-diethylformamide, N,N-diethylacetamide, N,N-dimethylmethoxyacetamide, dimethylsulfoxide, diethylsulfoxide, pyridine, dimethylsulfone, diethylsulfone, dipropylsulfone, hexamethylphosphoramide, tetramethylenesulfone, dimethyltetramethylenesulfone, and dimethoxytetramethylenesulfone. Mixtures of diluents can be employed when desired. The screenable dielectric composition of the present invention also includes a solid filler, which modifies some of the properties of polyimide, like e.g. its heat conductivity, its mechanical and thermal stability, its adherence and curability. Suitable solid fillers include zinc oxide, and alumina.

The filler employed generally has a particle size of about 0.25 to about 10 $\mu$m and preferably about 0.5 $\mu$m.

The composition must also include a constituent which functions as a detackifier and is compatible with the polymer portion of the composition. The detackifier reduces the tackiness or stickiness of the composition in order to facilitate and enhance the screening process used to apply the compositions to the predetermined portions of the substrate. This is particularly important since as the fineness of the screens increases, the importance in controlling the tackiness, 20 and also the viscosity becomes even more significant.

The component of the composition which has been referred to as the detackifier also functions as a viscosity adjuster to provide the proper viscosity of the composition for the screening application and to render the composition a practical, screenable preparation especially suitable for the intended purposes of the present invention in the preparation of dielectric layers between layers of metal circuitry.

The detackifying component of the composition actually is removed, during drying and curing such as by decomposition and vaporization. The detackifying component should not carbonize to an undesired extent and leave a residue on the substrate which would be difficult to remove in subsequent cleaning and removal steps.

It has been found according to the present invention that when the polymer of the film-forming polymer portion is a polyimide/polyamide, the detackifier can be a liquid silicone oil, a drying oil, a terpene or a terpineol. Mixtures of these particular detackifiers can be employed when desired as long as they are compatible with each other.

The detackifier according to the present invention when the film-forming polymer is a polyimide/amide can preferably include the terpenes, such as terpentine. Most preferably, the detackifier is one of the terpineols, such as α-terpineol.

In preparing the screenable composition the polyimide/amides are admixed with the inert diluent prior to admixture with the other components of the composition.

The compositions employed according to present invention generally have a viscosity of about 700 to about 50000 centipoises at 25° C. The preferred vixcosity of the compositions are about 1000 to about 13000 and the most preferred are about 7000 to about 12500 centipoises at 25° C.

The amount of detackifier in the screenable composition is about 1 to about 5% by weight and preferablye 4.1% by weight.

The weight amount of filler employed relative to the amount of film-forming polymer component in the composition is about 4:6 to about 6:4 and preferably about 1:1.

A typical process for employing the screenable composition used for the present invention includes applying the composition through a 360 to 400 mesh screen to a substrate such as a ceramic substrate onto which a layer of metal circuitry is deposited. A ceramic is a product of material manufactured by the action of heat on earthly raw materials. The preferred ceramic substrates include silicon oxides and silicates, such as aluminum silicate and aluminum oxides. The metal circuitry consists for example of an about 80 nm thick lower layer of chromium, an about 4 μm thick middle layer of copper and an about 80 nm thick upper layer of chromium.

The coating is generally applied to the substrate in a thickness of about 0.1 to about 10 mils and most preferably of about 1 mil. By screen printing this can be easily achieved since this method allows to obtain various predetermined layer thicknesses within small tolerances.

The coated substrates are then dried in order to cause hardening of the coating composition. This is needed to handle the coated substrates. The drying eliminates the tackiness of the surface of the dielectric so that no contamination of the surface with particles can occur. The drying also minimizes the interaction of residual solvent from the polyimide and the solvents contained in the photoresist. The drying is generally conducted at about 75 to about 120° C. for about 5 to about 16 minutes and preferably at about 90° C. for about 15 minutes. This step can also cause some, if not all, of the decomposition and vaporization of the detackifying component of the composition. The inert filler prevents premature imidization during the dryinq process.

On the deposited layer a photoresist mask with a hole pattern according to the desired pattern of via holes is formed by using conventional photolithographic techniques. Negative resists like the "Thin Film Resist" marketed by Waycoat or Kodac's KTFR and positive resists like the Shipley 1100 marketed by the Shipley Company can be used. With the photoresist mask as etch mask the via holes are etched into the deposited layer with.a potassium hydroxide solution. Preferably a 0.2 molar potassium hydroxide solution is used. Since the thickness of the filled polyimide material in the exposed areas is uniform and since the film polyimide due to the reaction inhibiting effect of the filler is also chemically homogeneous the etched via holes are uniform and have all the same geometric shape. Preferably the via holes have at their lower edge a diameter of about 1 to about 2 mils and at their upper edge a diameter of up to about 4 mils. A taper of about 45° of the via hole walls is mostly preferred.

To ensure that during photoresist stripping the filled polyimide layer retains its stability it is baked at 210° C. for about 10 to about 180 minutes, where 10 minutes are preferred, prior to the resist strip. Subsequently the resist is stripped and then the filled polyimide layer is cured at a temperature between about 300 and about 400-° C. for 15 minutes to 5 hours and preferably at about 360° C. for 30 minutes.

The filled polyimide layer is made between about .1 mil and about 10 mil and preferably about 1 mil thick. Its surface outside the via holes is essentially planar provided the thickness ratio of the metal circuitry and the filled polyimide does not exceed essentially 1:2. Due to the uniformity of the layer thickness on the one side over the substrate and on the other side over the metal circuitry the concern of the pinhole problem encountered with the known method is eliminated. The cured filled polyimide layer has a good heat conductivity and good dielectric properties.

In order to show that the method according to the invention produces pinhole free dielectric layers, one sample was processed in the same way as described above with the exception that no via holes were formed in it. At one corner of said substrate the filled polyimide was removed in order to be able to make electrical contact to the metal circuits. Then the sample was dipped into an electrolyte and on direct voltage was set to the electrolyte with the sample serving as the If the filled polyimide layer has pinholes, under these conditions hydrogen bubbles develop, that can be seen with a microscope. Such bubbles did not develop at layers produced by the inventive method.

The heat conductivity is tested by laying a thermo chip, i.e. a chip equipped with a thermo couple, on the cured filled polyimide layer. The temperature increase measured with the thermo couple if a current passes through the metal circuitry covered by the polyimide layer is a measure for the heat conductivity of said layer.

Onto the cured red filled polyimide layer a second layer of metal circuitry is formed that preferably consists of the same materials and exhibits the same layer thickness as the metal circuitry deposited on the substrate.

Conventional methods are used i.e. evaporating through a mask or photolithographically where a blanket layer of metal or layers of metal respectively are evaporated either on a photoresist mask followed by a lift-off step or directly on the filled polyimide layer followed by a photolithographic etch process.

To produce structures with a multilayer metal circuitry the above process steps starting with the application of the screenable composition onto the substrate are repeated once or several times.

After the uppermost layer of metal circuitry is formed the then present structure is covered with a passivating layer made from sputtered quartz, plastics or the filled polyimides of the dielectric layer between the metal layers.

The following two examples serve to illustrate preferred embodiments of the inventive method and are not intended to limit the teachings as set forth herein.

EXAMPLE I

The screenable composition used was prepared by taking a solution of 16 g of a polyamidocarboxylic acid, in 84 g N-methyl-2-pyrrolidone (this solution is marketed by DuPont under the tradename PI 2540), and adding to this solution 16 g $Al_2O_3$ particles with a size in the order of 0.5 μm and 5 g α-terpineol which had been premixed by ball-milling for several hours. In addition the whole composition is ball-milled for several hours to ensure uniformity.

This composition was screen coated through a 400 mesh screen onto several square ceramic substrates having a side length of 24, 28 and 36 mm onto which a layer of metal circuitry had been applied. The metal consisted of a lower layer of 80 nm chromium, a middle layer of about 4 μm copper and an upper layer of about 80 nm chromium. The thickness of the screen coated layer was about 25,4 μm (1 mil). It followed a drying step for 15 minutes at 90° C. Subsequently a photoresist mask containing a hole pattern corresponding to the desired pattern of via holes is formed from the Shipley 1100 resist by conventional photolithographic steps. With the exception of two samples that were spared for test purposes the samples were then subjected to a solvent etch in 0.2 molar potassium hydroxide solution to remove the filled polyimide in the areas exposed in the mask holes. Subsequently all of the samples were treated at 210° C. for 10 minutes and then the photoresist mask was stripped from all the samples followed by the final cure at 380° C. for 30 minutes. The surface of the screen coated layer was outside the via hole areas planar, all the via holes were uniform and had the same geometric shape. The diameter at their lower edge was about 1.5 mils and at their upper edge about 3 mils. The two samples without the via hole pattern were used to test the heat conductivity of the screen coated layer and for the search for pinholes. The tests proved the good heat conductivity of the layer and the absence of pinholes in it. Onto the then present structure a second layer of metal circuitry which was similar to the first layer was formed using conventional methods.

The screen coated layer had an excellent adherence to both layers of metal circuitry as found by the scotch tape test. In addition the finished structure showed that the screen coated layer had the same favorable physical and chemical properties as layers made from polyimide only.

EXAMPLE II

The screenable composition used in this example contained ZnO instead of $Al_2O_3$ as a filler. All the other factors like the amounts of the incredients the particle size of the filler, and the process parameters were the same as in example I. The structures produced in this example had equally favourable properties as the ones produced in Example I. While the invention has been particularly shown and described with reference to the embodiments thereof, it will be understood by those skilled in the art that the foregoing and other changes in form and detail may be made therein without departing from the spirit and scope of the invention.

We claim:

1. A structure comprising on a substrate successive layers of metal circuitry interconnected by via holes through a screen printed dielectric layer between the metal layers, the dielectric layer being comprised of a cured admixture of (1) an imidizable polyimide/amide having a molecular weight from about 500 to about 2500 prepared by the reaction of an aromatic diamine with an aromatic tetracarboxylic acid amhydride and (2) an oxide filler selected from the group consisting of aluminum oxide and zinc oxide, wherein said dielectric layers is etched in its uncured imidizable state to form the via holes.

2. The structure in accordance with claim 1 wherein the admixture comprises about 40 to about 60% by weight of the imedizable polymide/amide and about 60 to 40% by weight of the oxide filler.

3. The structure in accordance with claim 1 wherein the admixture is comprised of about 50% by weight of the imidizable polyimide/amide and about 50% by weight of the oxide.

4. The structure in accordance with claim 1 wherein the oxide has a particle size of about 0.25 to about 10 um.

5. The structure in accordance with claim 1 wherein the imidizable polyimide/amide is a polyamidocarboxylic acid.

6. The structure is accordance with claim 1 wherein the oxide filler is aluminum oxide.

7. The structure is accordance with claim 1 wherein the oxide filler is zinc oxide.

* * * * *